United States Patent [19]
Wilwerding

[11] Patent Number: 4,695,719
[45] Date of Patent: Sep. 22, 1987

[54] APPARATUS AND METHOD FOR OPTO-ELECTRONIC PACKAGE

[75] Inventor: Dennis J. Wilwerding, Littleton, Colo.

[73] Assignee: Honeywell Inc., Minneapolis, Minn.

[21] Appl. No.: 557,972

[22] Filed: Dec. 5, 1983

[51] Int. Cl.$^4$ ............................................. E04G 17/06
[52] U.S. Cl. ..................... 250/216; 250/239; 250/578; 350/167; 350/320
[58] Field of Search ............... 250/216, 239, 578; 350/167, 320

[56] References Cited

U.S. PATENT DOCUMENTS

| | | | |
|---|---|---|---|
| 4,230,941 | 10/1980 | Stauffer | 250/216 |
| 4,230,942 | 10/1980 | Stauffer | 250/216 |
| 4,246,476 | 1/1981 | Stauffer | 250/201 |

FOREIGN PATENT DOCUMENTS 55-106420  8/1980  Japan .

OTHER PUBLICATIONS

K. Iga et al., "2-D Array Lightwave Components Using Planar Microlenses", ECOC 1983, 4.20.
K. Iga et al., "3-Dimensional Ray Optics for Distributed-Index Planar Micro-Lens", Bull. P.M.E. (T.I.T.) No. 50, Aug. 1982, pp. 19-27.
M. Oikawa et al., "Array of Distributed-Index Planar Micro-Lenses Prepared from Ion Exchange Technique", Japanese Journal of Applied Physics, vol. 20, No. 4, Apr. 1981, pp. L296-298.
M. Oikawa et al., "Distributed-Index Planar Microlens", Applied Optics, vol. 21, No. 6, 15 Mar., 1982, pp. 1052-1056.
N. Yamamoto et al., "Imaging at Unit Magnification with Two-Dimensional Planar Microlens Array", 4th Topical Meeting on Gradient-Index Optical Imaging Systems—International Conference Center Kobe, Kobe, Japan, Jul. 4-5, 1983—Technical Digest, pp. 224-227.
N. Borrelli et al., "Planar Gradient Index Structures", 4th Topical Meeting on Gradient-Index Optical Imaging Systems, International Conference Kobe, Kobe, Japan, Jul. 4-5, 1983, Technical Digest, pp. 92-96.
K. Iga et al., "A Concept of Stacked Planar Optics", Bull. P.M.E. (T.I.T.) No. 49, Mar. 1982, pp. 17-24.

*Primary Examiner*—Janyce A. Bell
*Attorney, Agent, or Firm*—Charles J. Ungemach

[57] ABSTRACT

An opto-electronic package in which the cover of the package is made so as to have the optical components including lenslets, filters and masks as part thereof so that the assembly of the package may be simplified and that problems associated with different indices of thermal expansion among the parts is reduced.

19 Claims, 2 Drawing Figures

APPARATUS AND METHOD FOR OPTO-ELECTRONIC PACKAGE

BACKGROUND OF THE INVENTION

In the art of autofocus cameras, a passive system has been developed where light from a remote object passes through the taking lens of the camera and then passes through a plurality of lenslets so as to create images of the exit pupil of the taking lens on pairs of detectors mounted behind the lenslets, the detectors usually being part of an integrated circuit chip. Such a system is found in the Norman L. Stauffer U.S. Pat. No. 4,185,191, issued Jan. 22, 1980.

In a co-pending application, Ser. No. 249,032, filed Mar. 30, 1981 now U.S. Pat. No. 4,425,501 in the name of Norman L. Stauffer, and assigned to the present assignee, an opto-electronic package is shown wherein a plurality of detector pairs and circuit components occupy a circuit chip over which a plurality of lenslets are placed and then on top of the lenslet array, a masking structure is placed so that light passes only through the lenslets and not through the areas adjacent the lenslets on the lenslet array. A corrector lens and a filter are also shown in this prior application and, although not shown, the die containing the detector pairs and electronic circuitry is normally attached to a substrate and a transparent cover is placed over the components and fixed to the substrate so that the unit may be sold to camera manufacturers for use in their autofocus circuits. The package above-described involves considerable manual effort to assemble which causes an undesirably high cost and furthermore, the lenslet array being made of plastic, can produce errors since it has a higher co-efficient of thermal expansion than do the silica and alumina components with which it is associated. Efforts to reduce the cost have been accomplished in, for example, elimination of the corrector lens and the bonding of a dichroic filter to the cover in order to reduce the number of components being assembled. Unfortunately, the remaining components are still too many to reduce the cost significantly and the problem of the plastic having a higher temperature co-efficient still remains.

SUMMARY OF THE INVENTION

The present invention overcomes the problems in the prior art by, among other things forming the individual lenslets into the lower side of the cover by a process referred to herein as a gradient index diffusion process or technique which is known in the prior art. Such technique involves diffusion of ions with a different index of refraction into a substrate such as glass to form lenses therein. Descriptions of the diffusion technique for forming lenses and microlenses arrays may be seen in the articles (1) K. Iga, M. Oikawa, S Misawa, T. Yamasaki and N. Yamamoto entitled "2-D Array Lightwave Components Using Planar Microlenses", ECOC 1983, 4.20; (2) K. Iga, M Oikawa and J. Banno entitled "3-Dimensional Ray Optics For Distributed-Index Planar Micro-lens", BULL. P.M.E. (T.I.T) No. 50, Aug. 1982, pp. 19–27; 3) M. Oikawa, K. Iga, T. Sanada, N. Yamamoto and K. Nishizawa entitled "Array of Distributed-Index Planar Micro-Lenses Prepared From Ion Exchange Technique", Japanese Journal of Applied Physics, Vol. 20, No. 4, Apr. 1981, pp. L296-298; 4) "New Planar Gradient Index Structures Produced", Laser Focus/Electro-Optics, Sept. 1983, p. 44; (5) M. Oikawa and K. Iga entitled "Distributed-Index Planar Microlens", Applied Optics, Vol. 21, No. 6, Mar. 15, 1982, pp. 1052–1056; (6) N. Yamamoto and T. Yamasaki entitled "Imaging at Unit Magnification With Two-Dimensional Planar Microlens Array", 4th Topical Meeting on Gradient-Index Optical Imaging Systems—International Conference Center Kobe, Kobe Japan, July 4-5, 1983—Technical Digest, pp. 224–227; (7) N. Borrelli and D. L. Morse entitled "Planar Gradient Index Structures", 4th Topical Meeting on Gradient-Index Optical Imaging Systems, International Conference Center Kobe, Kobe, Japan, July 4-5, 1983, Technical Digest, pp. 92–96; and (8) K. Iga and M. Oikawa entitled "A Concept of Stacked Planar Optics", BULL P.M.E. (T.I.T.) No. 49, Mar. 1982, pp. 17–24.

After the lenslets are made by the above described processes, the aperture mask may also be created by a similar process along the lower surface of the cover around the lenslets. The cover may then be processed to have the dichroic filter bonded thereon to block radiation of undesired frequencies. The cover therefore becomes a combination cover, filter, lenslet array and aperture mask and instead of having to mount four separate objects over the detectors, only one must be so positioned, thus decreasing the amount of labor involved and, because the lenslets are now glass rather than plastic, the thermal co-efficient problem is overcome.

DETAILED DESCRIPTION OF THE PREFERRED EMBODIMENT

Figure 1:
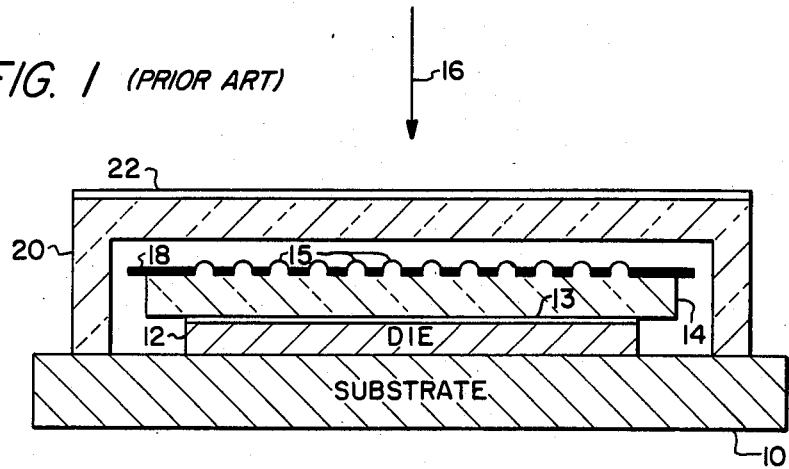
FIG. 1 is a cross-sectional view of the optoelectronic package as produced in the prior art.

The prior art device of FIG. 1 includes a substrate 10 composed of, for example, alumina and upon which electrical leads (not shown) to the exterior are normally formed. A die member 12 having thereon electronic components 13 comprising detectors and the electronic circuits necessary for use in the autofocus equipment is mounted on the substrate 10. A plastic lenslet array 14 with lenslets such as 15 is shown over die 12 and the components 13 and operates to direct radiation coming from a remote object along a path shown generally by arrow 16 to the detectors on die 12. An aperture mask 18 lies over the lenslet array 14 so as to block radiation between the lenslets 15. A cover 20 to which a dichroic filter 22 has been attached is shown in FIG. 1 fitting over the die 12, components 13, lenslet array 14 and mask 18 so as to form an opto-electronic package to be used by camera manufacturers with their autofocus equipment.

The process for assembling the package shown in FIG. 1 is presently: (1) bonding the die 12 having the components 13 thereon to the ceramic substrate 10; (2) gluing the acrylic lenslet array 14 over the die 12; (3) heat staking the aperture mask 18 to the lenslet array 14; (4) bonding the dichroic filter 22 to the plastic cover 20; and (5) gluing the cover 20 to the substrate 10 to form the package.

Figure 2:
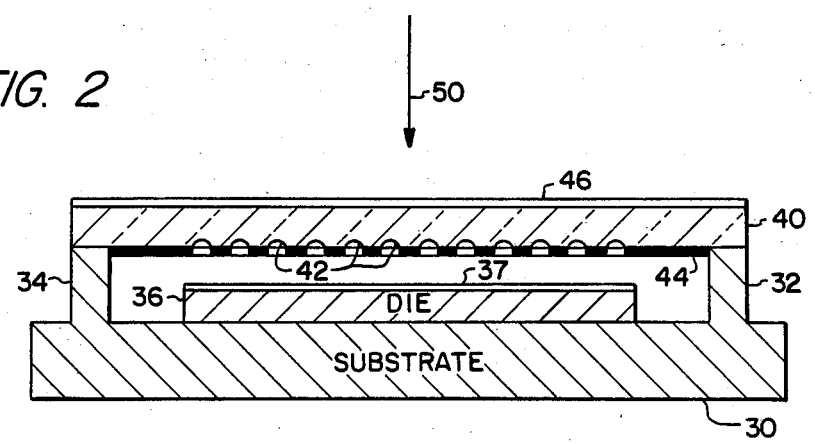
FIG. 2 is a cross-sectional view of the optoelectronic package constructed in accordance with the present invention.

This approach is very labor intensive and has difficulties in that the plastic parts have higher co-efficients of thermal expansion than the other parts and errors can occur when the package undergoes temperature variations In FIG. 2, the apparatus of the present invention is shown comprising a substrate 30 which, like substrate 10 in FIG. 1 may be of, for example, alumina with the electrical connections (not shown) emerging therefrom for connection to autofocus circuitry of the camera manufacturer. Substrate 30 is shown in FIG. 2 as having vertical extending portions 32 and 34 for purposes of accommodating the cover as will be explained.

As in FIG. 2, a die 36 upon which the electronic components 37 including detectors and electronic circuitry have been formed is attached to the substrate 30.

FIG. 2 shows a cover 40 made of glass or other material having a lower temperature co-efficient of expansion than plastic, connected to the vertically extending members 32 and 34 to form the opto-electronic package. Cover 40 is shown having a plurality of lenslets such as 42 formed therein and with an aperture mask 44 on the lower surface thereof. A dichroic filter 46 is shown formed on top of the cover 40 and the cover 40 is made in a process which will be explained below so as to be a unitary piece which may be assembled in one step rather than, as in FIG. 1, where the lenslets, mask and cover are assembled in three separate steps. It should be noted that the cover 40 can be inverted, being careful of the spacing requirements so that the lenslets and mask are on top. Also, the dichroic filter 46 may be on the same side as the lenslets and mask, if desired.

Radiation from a remote object passes in a direction such as shown by arrow 50 through the dichroic filter 46, the glass cover 40 and the lenslets 42 so as to reach the detector elements on die 36 while the mask 44 blocks radiation between the lenslets in the same manner as has been heretofore shown.

The method of constructing the apparatus of FIG. 2 consists a bonding the die 36 with the components 37 thereon to the ceramic substrate 30 and then gluing the cover 40 to the vertical extending portions 32 and 34 of substrate 30 and, as can be seen, the assembly process is greatly simplified over that used in connections with FIG. 1.

The cover 40 may be fabricated in an IC type process where many devices are made at one time on a plate. The process for creating the lenslets 42 may be any of those described in the above referred to articles and, in general, it involves the diffusion of ions having a different index of refraction in to a glass substrate. For simplicity herein, the procedure will be referred to as the diffusion technique or process. The process of making the cover 40 generally involves the following steps: (1) vacuum depositing a metal on the glass surface of cover 40; (2) depositing a photoresist over the metal; (3) exposing the photoresist to light at the areas where lenslets are to be formed; (4) developing the resist so as to leave soft spots at the lenslet positions; (5) washing away the soft spots so as to leave the metal exposed in the areas where the lenslets are to be formed; (6) etching with an acid to carve away the metal where the soft spots have been washed away; (7) forming the lenslets 42 into the surface of cover 40 by a diffusion process; (8) removing all of the remaining metal along the surface of the cover 40; (9) repeating steps one through 6 above so as to leave a mask 44 on the lower surface of the cover 40 except in the positions occupied by the lenslets 42; and (10) depositing the dichroic filter 46 on the upper surface of the cover 40.

As can be seen, the process of assembling the opto-electronic package has been considerably simplified, thus cutting the cost of the unit by a significant amount. As is also seen, the use of glass rather than plastic for the creation of the lenslets minimizes any problems that could result from the differences in thermal expansion between the various parts.

It is seen that many changes and modifications may be made to the apparatus and process shown in connections with the preferred embodiment herein described and I do not wish to be limited to the specific disclosures used in connection therewith. I intend only to be limited by the following claims.

I claim:

1. In the process of making an opto-electronic package for ranging devices having a substrate, a die with electronic components and radiation detectors thereon, a plurality of lenslets with a mask therebetween mounted adjacent the die and a transparent cover adjacent the lenslets and mask and attached to the substrate so that radiation is directed by the lenslets to the detectors and not the electronic components, the improvement comprising:
   constructing the lenslets in the cover on one side.

2. The process of claim 1 further comprising: forming the mask on the cover between the lenslets.

3. The process of claim 2 further comprising: forming a dichroic fitter on the cover.

4. The method of constructing an opto-electronic package for ranging devices comprising the steps of:
   (1) forming a plurality of lenslets in a transparent cover.
   (2) mounting a die with electronic components and radiation detectors thereon to a substrate, and
   (3) mounting the cover to the substrate so that the lenslets direct radiation to the detectors and not to the electronics components.

5. The method of claim 4 further comprising the step of applying an opaque material around the lenslets on the cover.

6. The method of claim 5 further including the step of depositing a dichroic filter on the cover to block radiation of undesired frequencies.

7. An opto-electronic package for ranging devices comprising:
   a substrate;
   a die having electronic components and radiation detectors thereon attached to the substrate; and
   a transparent cover having a plurality of lenslets formed therein and attached to the substrate so that the lenslets direct radiation to the detectors.

8. Apparatus according to claim 7 further including an opaque mask surrounding the lenslets on the cover so as to prevent radiation from reaching areas on the die other than the detectors.

9. Apparatus according to claim 8 further including a dichroic filter on the cover to block radiation of undesired frequencies.

10. Apparatus according to claim 7 wherein the transparent cover is glass.

11. Apparatus according to claim 10 wherein the lenslets are formed by a diffusion process.

12. A cover of transparent material for an opto-electronic package comprising:
   a plurality of lenslets formed by a diffusion process on one side of the cover; and
   an opaque material formed around the lenslets.

13. The cover of claim 12 further including a dichroic filter formed on the cover.

14. The cover of claim 12 wherein the transparent material is glass.

15. The method of constructing a cover for an opto-electronic package comprising the steps of:

(1) depositing a metal layer on one side of the cover, (2) depositing a photoresist layer over the metal layer, (3) exposing the photoresist to a predetermined pattern of light, (4) developing the photoresist to soften the predetermined pattern, (5) washing the rest away in the soft spots, (6) etching the metal away in the exposed areas to leave spots in the pattern where lenslets are to be formed, (7) forming the lenslets in the pattern by a diffusion process, (8) removing the remaining metal, and (9) repeating steps (1)–(6) to form a mask.

16. The method of claim 15 further including the step of depositing a dichroic fitter on the cover.

17. The process of claim 1 wherein the constructing the lenslets in the cover is performed by a diffusion technique.

18. The method of claim 4 wherein the forming of a plurality of lenslets in the transparent cover is performed by a diffusion process.

19. The package of claim 7 wherein the transparent cover has the lenslets formed therein by a diffusion process.

* * * * *